(12) United States Patent
Grasso et al.

(10) Patent No.: US 6,611,154 B2
(45) Date of Patent: Aug. 26, 2003

(54) CIRCUIT FOR IMPROVING NOISE IMMUNITY BY DV/DT BOOSTING

(75) Inventors: Massimo Grasso, Pavia (IT); Muthu Subaramanian, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/186,554

(22) Filed: Jun. 28, 2002

(65) Prior Publication Data

US 2003/0001609 A1 Jan. 2, 2003

Related U.S. Application Data

(60) Provisional application No. 60/301,827, filed on Jul. 2, 2001.

(51) Int. Cl.[7] .................. H03K 19/0175; H03K 19/003
(52) U.S. Cl. .............................. 326/83; 326/31
(58) Field of Search ............... 326/80–83, 86, 326/26–27, 31, 34

(56) References Cited

U.S. PATENT DOCUMENTS

| | | | |
|---|---|---|---|
| 5,001,369 A | * 3/1991 | Lee | 326/58 |
| 5,933,021 A | * 8/1999 | Mohd | 326/30 |
| 5,955,911 A | 9/1999 | Drost et al. | 327/404 |
| 6,184,701 B1 | 2/2001 | Kim et al. | 326/21 |
| 6,281,706 B1 | * 8/2001 | Wert et al. | 326/83 |

FOREIGN PATENT DOCUMENTS

JP          05283944 A  * 10/1993  ............. H03F/3/34

* cited by examiner

*Primary Examiner*—Michael Tokar
*Assistant Examiner*—James Cho
(74) *Attorney, Agent, or Firm*—Ostrolenk, Faber, Gerb & Soffen, LL

(57) ABSTRACT

A circuit for suppressing false operation of a level shift circuit due to a noise transient, the circuit comprising a first transistor coupled to a voltage source of the level shift circuit and being coupled to pass a current when a noise transient is present on the voltage source an output terminal coupled to the first transistor providing as an injected signal a current proportional to the current in the first transistor to at least one level shift transistor of the level shift circuit to prevent false triggering of the level shift circuit due to the noise transient.

24 Claims, 3 Drawing Sheets

CIRCUIT FOR IMPROVING NOISE IMMUNITY BY DV/DT BOOSTING

CROSS REFERENCE TO RELATED APPLICATION

The present application claims the benefit and priority of U.S. Provisional Patent Application Serial No. 60/301,827 filed Jul. 2, 2001 and entitled "DV/DT BOOSTER FOR NOISE IMMUNITY", the entire disclosure of which is incorporated by reference herein.

BACKGROUND OF THE INVENTION

1. Field of the Invention

The present invention relates to a level shift circuit for high frequency level shift operation and, more specifically, to a circuit which provides immunity against common mode variations for high frequency level shift operations.

2. Description of the Related Art

Level shift circuits for shifting the potential of a small control signal to a higher or a lower voltage level are well known, and are frequently implemented into power integrated circuit chips. A typical power integrated circuit chip is the IR2151 sold by the International Rectifier Corporation, the assignee of the present invention. The IR2151 is a high voltage, high speed MOS gated IC with independent high side and low side outputs for driving the gates of high side and low side power transistors (typically power MOSFETs or insulated gate bipolar transistors ("IGBTs")) arranged in a half-bridge configuration. The level shift circuit is used in such power integrated circuits for raising the voltage level of the control signal for the high side power transistor to a level near the level of the high voltage rail.

Level shift circuits such as the one used in the IR2151 power IC are typically pulse-based circuits in which the input control signal is converted into pulses at the rising and falling edges of the control signal to provide "set" and "reset" for a latch which in turn controls the gate of the high side power transistor. By level shifting these pulses, instead of the control signal, the level shift circuit is turned on only briefly, thereby dissipating much less power.

U.S. Pat. No. 5,514,981, assigned to the assignee of the present invention and incorporated herein by reference, discloses a "reset dominant" scheme for a pulse-based level shift circuit which prevents false operation, i.e., the production of an output which is not called for by the logic input, as a result of a noise "glitch" or false pulse. FIG. 1 of the present application shows the pulse-based level shift circuit of U.S. Pat. No. 5,514,981, in which rising and falling edges of an input signal cause a pulse generator 1 to produce set and reset pulses which are fed to respective high voltage level transistors 2, 3, which, after passing through pulse filter block 9, respectively set and reset an RS latch 4. The output 5 of RS latch 4, which constitutes the high voltage equivalent of the low voltage control signal, and is used to control the switching of output transistors 6, 7 which in turn produce a signal at an intermediate pin HO which is used to gate the high side power transistor connected to the IC.

One problem associated with pulse-based level shift circuits such as those shown in FIG. 1 is that the pulses are of a constant width and amplitude, which affects both propagation delay from input to output and also power dissipation, potentially limiting frequency of operation.

To overcome the above-noted limitation, an alternative level shift circuit has been proposed, which is disclosed and claimed in U.S. Ser. No. 09/984,084, filed Oct. 26, 2001 (IR-1934), which does not operate on pulses generated from the input signal, and is thus not constrained by pulse characteristics. Referring to FIG. 2, this non-pulse level shift circuit includes switching circuitry (namely, transistors 20 and 22 and inverter 24), which responds to transitions between high and low values in the input signal, turning a first current path on in response to a low-to-high transition in the input signal $V_{IN}$, and turning a second current path on in response to a high-to-low transition in the input signal. This is accomplished by driving the gates of transistors 20 and 22 with two anti-phase signals: transistor 20 receives IN, which is the input signal from source $V_{IN}$ without inversion; transistor 22 receives IN*, which is an inverted version of input signal $V_{IN}$ produced by inverter 24.

The shifting circuitry of the non-pulse level shift circuit shown in FIG. 2 is formed of enhancement-mode transistors 30 and 32 and provides output signals OUT and OUT* at nodes 34 and 36. The shifting circuitry responds to the current flowing in the first and second paths, thereby shifting the level of the output signals (OUT or OUT*) according to a transition in the input signal and turning off the path that was turned on by the switching circuitry.

The parasitic capacitance associated with transistors 2, 3 in the prior art level shift circuit of FIG. 1, and with transistors 20 and 22 in the non-pulse based level shift circuit of FIG. 2, are primarily associated with the dv/dt problem. When a dv/dt occurs on the Vs node, false operation of the IC can occur unless sufficient current is supplied to charge these parasitic capacitances.

By implementing the circuit of the present invention, the need for a pulse filter block 9 is reduced or eliminated, which in turn reduces the propagation delay of the IC.

SUMMARY OF THE INVENTION

The circuit of the present invention advantageously overcomes the above-noted deficiencies of the prior art by sensing the amount of current that must be supplied to the parasitic capacitors associated with the level shift transistors during a dv/dt condition, and injecting this current in a timely manner to prevent false operation of the IC.

Other features and advantages of the present invention will become apparent from the following description of the invention which refers to the accompanying drawings.

BRIEF DESCRIPTION OF THE DRAWING(S)

The invention will now be described in the following detailed description with reference to the drawings in which.

DETAILED DESCRIPTION OF THE PREFERRED EMBODIMENT

Figure 2:
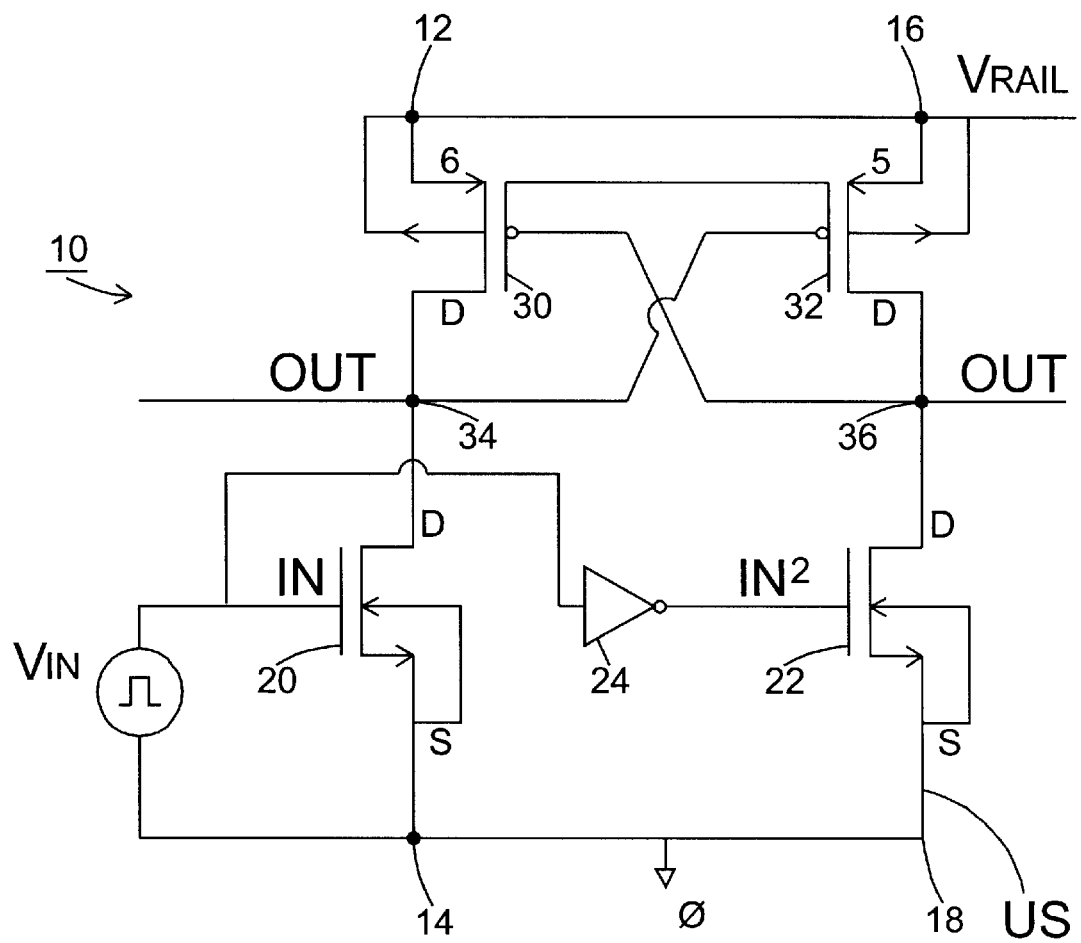
FIG. 2 shows an alternative known level shift circuit.
Figure 3:
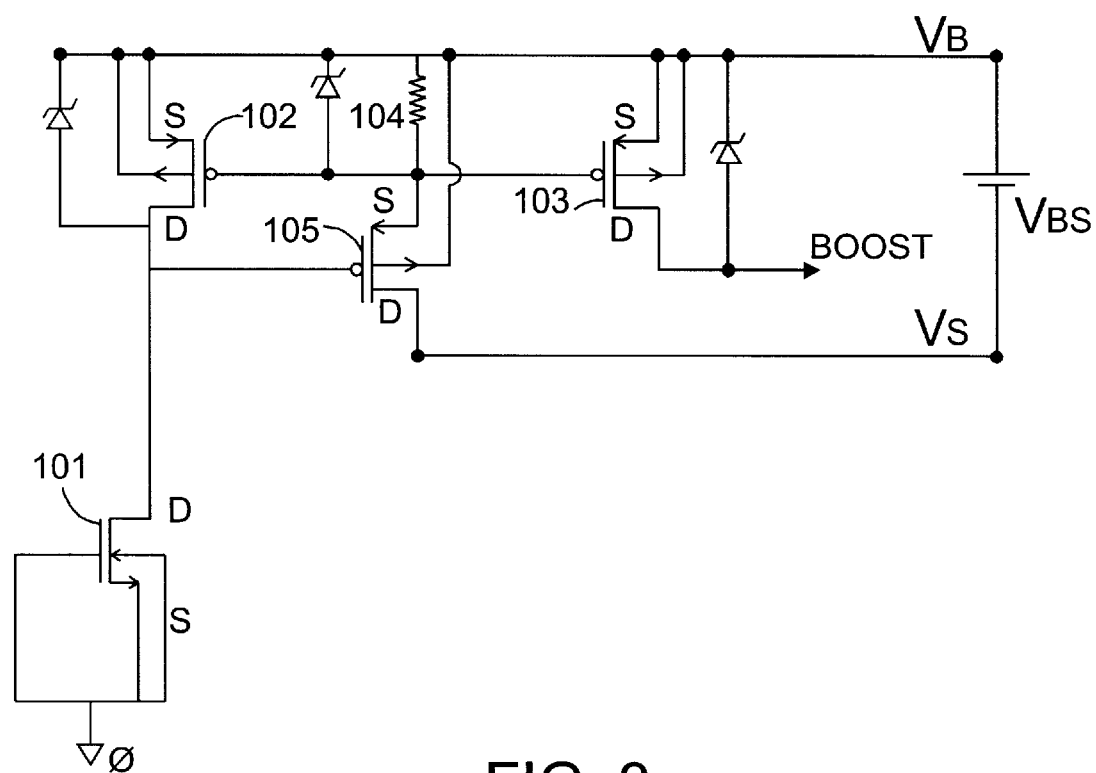
FIG. 3 shows the circuit according to the present invention.

Referring to FIG. 3, a circuit diagram of the present invention is shown. Assume that the level shift circuit has finished translating the input signal and it is in a stable state. In the circuit of the present invention, the transistor 101 is a dummy transistor which is always OFF. Depending on whichever level shift circuit it is connected to, transistor 101 is exactly similar in its construction to the transistors of block 2,3 in the prior art, (or) to the transistors 20 and 22 of FIG. 2. The purpose of transistor 101 is to imitate the real parasitic capacitance associated with these transistors.

Assume that there is a rising dv/dt on the node "VS". The voltage on node "Vs" will increase rapidly, which means "VB" which is a DC (VBS) voltage above "Vs" will also increase. An increase in "VB" will cause a sense current to flow through transistor 102, and the magnitude of this current is sensed from the parasitic capacitance of transistor 101. The current flowing through transistor 102 is mirrored through transistor 103, and is available at the node "Boost". The duration of this sense current depends on the duration of the dv/dt pulse and also on the RC delay provided by resistor 104 and transistor 105.

Figure 1:
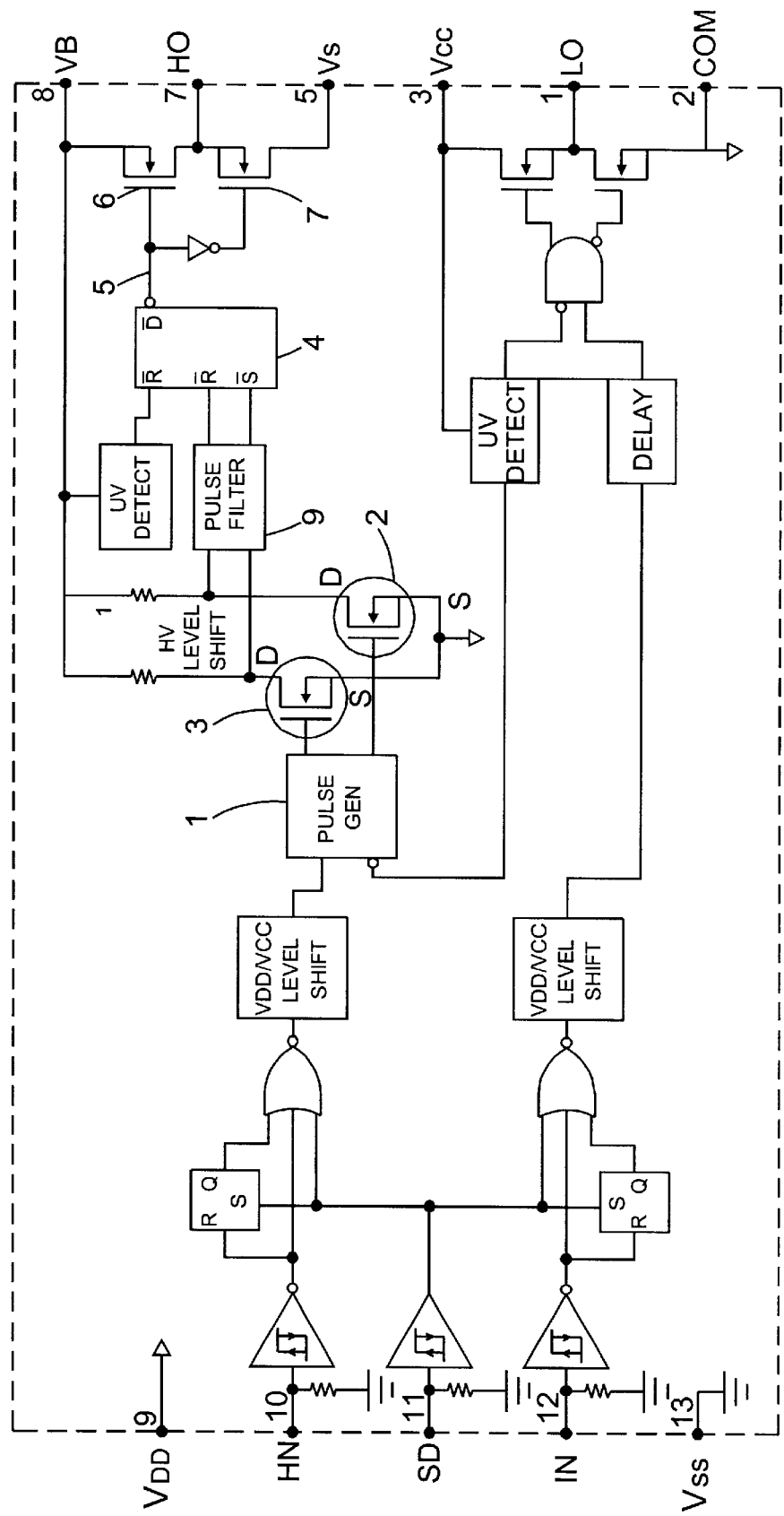
FIG. 1 shows a prior art pulse-based level shift circuit.

The current at node "Boost" is injected into the drain node of transistors 2, 3 of FIG. 1. This will prevent the false trigger of the output state due to a dv/dt condition.

In the circuit of FIG. 2, the current at the "Boost" node of FIG. 3 is injected into either node 34 or 36 depending on whether transistor 20 or 22 is OFF. If transistor 20 was OFF, which implies node 34 is high, the current from "Boost" node is injected into node 34 to ensure that this node stays high even during the dv/dt condition. If this node goes low, it could result in a output false state with respect to input VIN.

The present invention thus uses the transient noise or dv/dt signals to provide a "boost" current to the level shift circuit to prevent false operation thereof when the noise or dv/dt conditions occur.

Although the present invention has been described in relation to particular embodiments thereof, many other variations and modifications and other uses will become apparent to those skilled in the art. Therefore, the present invention should not be limited by the specific disclosure herein.

What is claimed is:

1. A circuit for suppressing false operation of a level shift circuit due to a noise transient, the circuit comprising:
   - a first transistor coupled to a voltage source of the level shift circuit and being coupled to pass a current when a noise transient is present on said voltage source; and
   - an output terminal coupled to the first transistor providing as an injected signal a current proportional to said current in said first transistor to at least one level shift transistor of the level shift circuit to prevent false triggering of the level shift circuit due to the noise transient.

2. The circuit of claim 1, further comprising:
   - a capacitance element that simulates a parasitic capacitance of a transistor in the level shift circuit;
   - the first transistor being coupled in series with the capacitance element and having a control input coupled to the voltage source of the level shift circuit affected by the noise transient,
   - further comprising a further transistor coupled to the first transistor as a current mirror for mirroring the current flowing in the first transistor; and
   - the output terminal providing as the injected signal a current flowing in said further transistor mirroring the current in the first transistor to the at least one level shift transistor of the level shift circuit to prevent false triggering of the level shift circuit due to the noise transient.

3. The circuit of claim 2, wherein the capacitance element comprises a second transistor.

4. The circuit of claim 2, further comprising a delay circuit coupled to said first and further transistors for delaying the current flowing through said first and further transistors and determining a duration of the injected signal.

5. The circuit of claim 4, wherein the delay circuit comprises an RC circuit.

6. The circuit of claim 5, wherein the RC circuit comprises a resistor and an additional transistor coupled in series.

7. The circuit of claim 6, wherein a common connection of the resistor and additional transistor is coupled to the control input of the first and further transistors.

8. The circuit of claim 6, wherein the first, second, further and additional transistors comprises FETs.

9. The circuit of claim 1, wherein the injected signal is provided to a drain node of the at least one level shift transistor of the level shift circuit.

10. The circuit of claim 1, wherein the injected signal is provided to a drain node of the at least one level shift transistor of the level shift circuit, which drain node is in a high state to ensure that the node stays high during the noise transient.

11. A circuit for suppressing false operation of a level shift circuit due to a noise transient, the circuit comprising:
    - a first transistor having a control input coupled to a voltage source of the level shift circuit affected by the noise transient,
    - a second transistor coupled in series with the first transistor and which simulates a parasitic capacitance of a transistor in the level shift circuit;
    - a third transistor coupled to the first transistor as a current mirror for mirroring a current flowing in the first transistor; and
    - an output terminal providing as an injected signal a current flowing in said third transistor mirroring the current in the first transistor and coupled to at least one level shift transistor in the level shift circuit to prevent false triggering of the level shift circuit due to the noise transient.

12. The circuit of claim 11, further comprising a delay circuit coupled to said first and third transistor for delaying the current flowing through said first and third transistors and determining a duration of the injected signal.

13. The circuit of claim 12, wherein the delay circuit comprises an RC circuit.

14. The circuit of claim 13, wherein the RC circuit comprises a resistor and a fourth transistor coupled in series.

15. The circuit of claim 14, wherein a common connection of the resistor and fourth transistor is coupled to the control input of the first and third transistors.

16. The circuit of claim 14, wherein the first, second, third and fourth transistors comprises FETs.

17. The circuit of claim 11, wherein the injected signal is provided to a drain node of the at least one level shift transistor of the level shift circuit.

18. The circuit of claim 11, wherein the injected signal is provided to a drain node of the at least one level shift transistor of the level shift circuit, which drain node is in a high state to ensure that the node stays high during the noise transient.

19. A method for suppressing false operation of a level shaft circuit due to a noise transient, the method comprising:
    - providing a first transistor having a control input coupled to a voltage source of the level shift circuit affected by the noise transient and passing a current through the first transistor in response to the noise transient present on the voltage source; and
    - providing an injection signal in response to said current in the first transistor to at least one level shift transistor of the level shift circuit to prevent false trigering of the level shift circuit due to the noise transient.

20. The method of claim 19, further comprising:

providing a capacitance element that simulates a parasitic capacitance of a transistor in the level shift circuit;

providing a further transistor coupled to the first transistor as a current mirror for mirroring the current flowing in the first transistor; and providing as the injected signal a current flowing in said further transistor mirroring the current in the first transistor and coupled to the at least one level shift transistor of the level shift circuit to prevent false triggering of the level shift circuit due to the noise transient.

21. The method of claim 20, further comprising delaying the current flowing through said first and further transistors and determining a duration of the injected signal.

22. The method of claim 20, wherein the step of providing a capacitance element comprises using an FET as a capacitance element.

23. The method of claim 19, wherein the step of providing an injection signal comprises providing the injection signal to a drain node of the at least one level shift transistor of the level shift circuit.

24. The method of claim 19, wherein the step of providing an injection signal comprises providing the injection signal to a drain node of the at least one level shift transistor of the level shift circuit, which drain node is in a high state to ensure that the node stays high during the noise transient.

* * * * *